(12) United States Patent
Cao et al.

(10) Patent No.: US 8,337,958 B2
(45) Date of Patent: *Dec. 25, 2012

(54) MANUFACTURING PROCESS OF ELECTRODES FOR ELECTROLYSIS

(75) Inventors: Yi Cao, Fujisawa (JP); Masashi Hosonuma, Fujisawa (JP)

(73) Assignee: Permelec Electrode Ltd., Kanagawa (JP)

( * ) Notice: Subject to any disclaimer, the term of this patent is extended or adjusted under 35 U.S.C. 154(b) by 952 days.

This patent is subject to a terminal disclaimer.

(21) Appl. No.: 12/381,962

(22) Filed: Mar. 18, 2009

(65) Prior Publication Data

US 2009/0246410 A1    Oct. 1, 2009

(30) Foreign Application Priority Data

Mar. 31, 2008 (JP) ................................. 2008-089250

(51) Int. Cl.
*C23C 14/30* (2006.01)
*C23C 14/58* (2006.01)
*B05D 3/02* (2006.01)
*B05D 5/12* (2006.01)

(52) U.S. Cl. .......... 427/528; 427/531; 427/580; 427/78; 427/124; 427/125; 427/126.5; 427/126.3; 427/226; 427/376.3; 427/383.3; 204/192.38

(58) Field of Classification Search .................. None
See application file for complete search history.

(56) References Cited

U.S. PATENT DOCUMENTS

| | | | |
|---|---|---|---|
| 3,933,616 A | 1/1976 | Beer | |
| 4,052,271 A | 10/1977 | Beer | |
| 4,325,776 A * | 4/1982 | Menzel | 117/8 |
| 4,364,099 A * | 12/1982 | Koyama et al. | 361/305 |
| 4,469,581 A | 9/1984 | Asano et al. | |
| 4,484,999 A | 11/1984 | Asano et al. | |
| 5,059,297 A | 10/1991 | Hirao et al. | |
| 5,593,556 A | 1/1997 | Kumagai et al. | |
| 7,232,508 B2 * | 6/2007 | Hosonuma | 204/290.12 |
| 7,722,966 B1 * | 5/2010 | Lee et al. | 428/702 |
| 7,842,353 B2 * | 11/2010 | Cao et al. | 427/528 |

(Continued)

FOREIGN PATENT DOCUMENTS

JP 57-192281 A 11/1982

(Continued)

OTHER PUBLICATIONS

SGTE alloy phase diagrams, copy Ta-Ti phase diagram, from www.CRCT.polymtl.ca/fact/documentation/SGTE/SGTE_Fig.htm (with copies exemplary calculations from website), Ta-Ti databases revise 2004 (no month).*

*Primary Examiner* — Marianne L Padgett
(74) *Attorney, Agent, or Firm* — Hamre, Schumann, Mueller & Larson, P.C.

(57) ABSTRACT

A process for manufacturing electrodes for electrolysis, including the steps of forming an arc ion plating undercoating layer comprising valve metal or valve metal alloy including a crystalline tantalum component and a crystalline titanium component on the surface of the electrode substrate comprising valve metal or valve metal alloy, by an arc ion plating method; heat sintering the electrode substrate to transform only the tantalum component of the arc ion plating undercoating layer into an amorphous substance; and forming an electrode catalyst layer on the surface of the arc ion plating undercoating layer including the valve metal or valve metal alloy including the tantalum component transformed to the amorphous substance and the crystalline titanium component.

5 Claims, 1 Drawing Sheet

U.S. PATENT DOCUMENTS

| | | | |
|---|---|---|---|
| 2003/0148145 A1* | 8/2003 | Yamamoto et al. | 428/698 |
| 2003/0205304 A1* | 11/2003 | Yamada et al. | 148/578 |
| 2006/0182999 A1* | 8/2006 | Yamamoto | 428/698 |

FOREIGN PATENT DOCUMENTS

| | | |
|---|---|---|
| JP | 59-038394 A | 3/1984 |
| JP | 2-247393 A | 10/1990 |
| JP | 2-282491 A | 11/1990 |
| JP | 5-171483 A | 7/1993 |
| JP | 6-306669 A | 11/1994 |
| JP | 7-090665 A | 4/1995 |
| JP | 7-229000 A | 8/1995 |
| JP | 2004-360067 A | 12/2004 |
| JP | 2007-154237 A | 6/2007 |
| JP | 2009-263770 A * | 11/2009 |

* cited by examiner

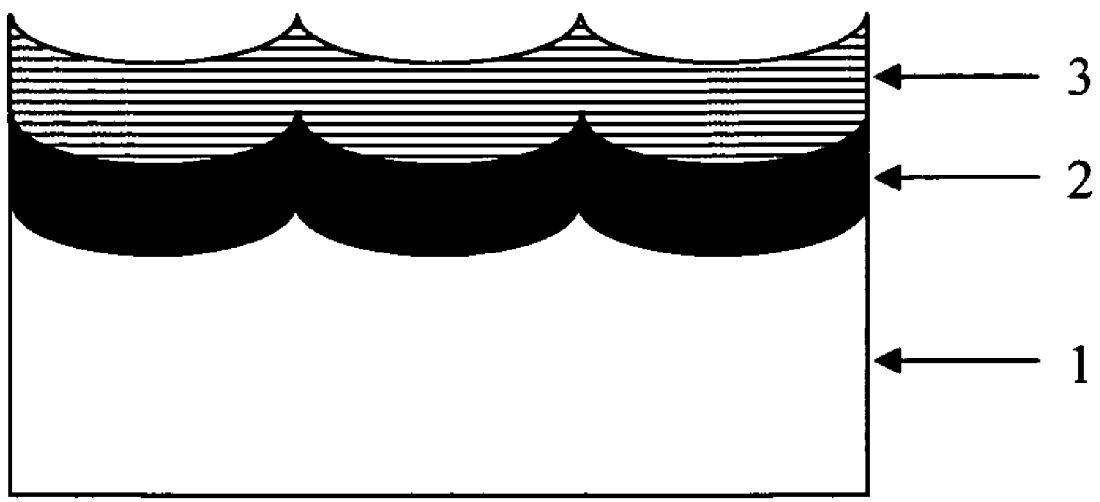

MANUFACTURING PROCESS OF ELECTRODES FOR ELECTROLYSIS

This application claims the priority of Japanese Patent Application 2008-89250 filed on Mar. 31, 2008, which application is incorporated herein by reference in its entirety.

BACKGROUND OF THE INVENTION

1. Field of the Invention

This invention relates to the manufacturing process of the electrodes for electrolysis to be applied for various kinds of electrolysis for the industrial purpose, especially relating to the manufacturing process of the electrodes for electrolysis with high durability in electrolysis for the industrial purposes including electrolysis copper foil manufacturing, aluminum electrolysis capacitor manufacturing by a liquid power feeding, and continuous galvanized iron sheet manufacturing, which is associated with oxygen generation at the anode.

2. Description of the Related Art

Recent electrolysis processes for the industrial purposes including electrolysis copper foil manufacturing, aluminum electrolysis capacitor manufacturing by a liquid power feeding, and continuous galvanized iron sheet manufacturing involve oxygen generation at the anode and therefore, anodes of a metal titanium substrate coated with iridium oxide as an electrode catalyst are widely applied due to its high resistance to oxygen generation. In this type of electrolysis for the industrial purposes, which involves oxygen generation at the anode, however, an organic substance or impurity elements are added for stabilization of the products, which causes various electrochemical and chemical reactions. These reactions may result in higher consumption of an electrode catalyst due to an increased concentration of hydrogen ions (lower pH value) associated with oxygen generation.

With an electrode catalyst of iridium oxide, popularly applied for the case of oxygen generation, electrode consumption is considered to start from consumption of itself and concomitantly occurring corrosion of the electrode substrate by the same reason, and as a result of partial and internal consumption and detachment of the electrode catalyst, electric current flows intensively onto the remaining part of the electrode catalyst, and thus the catalyst consumption proceeds continuously at accelerating pace.

Conventionally, in order to suppress corrosive dissolution of the electrode substrate and successive detachment of the effective electrode catalyst from the electrode substrate, various processes are applied, typically such as installing an interlayer between the titanium substrate and the electrode catalyst layer. Such interlayer is selected to have an electrode activity lower than that of the electrode catalyst layer and electron conductivity, designed to have a role to alleviate damages of the substrate by isolating the electrode substrate away from the oxygen generation area which causes low pH and corrosive electrolyte. As the interlayers satisfying these conditions, various processes are described in the patent documents shown below.

In Patent Document 1, an interlayer provided with tantalum and/or niobium oxide in a thickness between 0.001 g/m$^2$ and 1 g/m$^2$ as metal and having conductivity across the titanium oxide coating formed on the substrate surface was suggested.

In Patent Document 2, a valence-controlled semiconductor with oxides of tantalum and/or niobium added to oxides of titanium and/or tin was suggested. The processes described in Patent Document 1 and Patent Document 2 have been widely applied industrially.

In Patent Document 3, a metal oxide interlayer formed on an undercoating layer comprising an amorphous layer without grain boundary on the substrate surface prepared by vacuum sputtering was suggested.

Recently, however, reflecting demand for high economic efficiency, operation conditions have grown more and more stringent, and highly durable electrodes are requested. Under these circumstances, the processes to prepare an interlayer as described in Patent Documents 1-3 have not achieved to provide desired effects sufficiently.

In order to solve the problems associated with the preparation of interlayers in Patent Documents 1-3, a method to form an interlayer comprising a single layer of titanium oxide, where a titanium electrode substrate itself is electro-oxidized so that the surface of titanium on said electrode substrate is transformed into titanium oxide, is disclosed in Patent Document 4. With the electrode described in Patent Document 4, the interlayer formed by electro-oxidation is extremely thin to provide sufficient corrosion resistance; therefore, on the surface of said first interlayer prepared by electro-oxidization, the second thick titanium oxide single layer is additionally formed by a thermo-decomposition process, on which the electrode catalyst layer is configured. However, the method described in Patent Document 4 is poor in workability, less economical, and not practical since it requires two processes of works in preparing the interlayer; more specifically, electro-oxidization and thermo-decomposition, which require two completely different equipment and machinery.

In Patent Document 5, a highly corrosion resistant, dense interlayer, which is able to tightly bond with the electrode substrate, comprising a high-temperature oxide coating prepared by a high-temperature oxidation treatment of the electrode substrate between the electrode substrate and the electrode catalyst, was suggested. According to Patent Document 5, the oxide coating prepared by high temperature oxidation of the electrode substrate is highly corrosion resistant and dense, and tightly bonded with the electrode substrate, and thus can protect the electrode substrate and sufficiently support the electrode catalyst comprising mainly oxides, through oxide-oxide bonding.

In Patent Document 6, an interlayer with a double-layered structure to further enhance the effects of the method in Patent Document 5, comprising metal oxide and a high temperature oxide coating derived from the substrate by high temperature oxidation, was suggested. However, either of the methods by Patent Document 5 and Patent Document 6 is inadequate to form a highly corrosion resistant, dense interlayer capable of tightly bonding with the electrode substrate between the electrode substrate and the electrode catalyst, and could not obtain electrodes for electrolysis with enhanced density, electrolytic corrosion resistance and conductive property.

[Patent Document 1] JP 60-21232 B Patent Gazette
[Patent Document 2] JP 60-22074 B Patent Gazette
[Patent Document 3] JP 2761751 B Patent Gazette
[Patent Document 4] JP 7-90665 A Patent Gazette
[Patent Document 5] JP 2004-360067 A Patent Gazette
[Patent Document 6] JP 2007-154237 A Patent Gazette

SUMMARY OF THE INVENTION

The present invention aims to solve the problems of conventional technologies as above-mentioned and to provide electrodes for electrolysis with higher density, higher electrolysis corrosion resistance and enhanced conductivity, and the manufacturing process thereof for said various kinds of electrolysis for the industrial purpose.

In order to achieve said objectives, the present invention, as the first means for solving the problems, is to provide a manufacturing process of the electrodes for electrolysis, characterized by; the process to form an arc ion plated undercoating layer (hereafter called the AIP undercoating layer) comprising a valve metal or a valve metal alloy containing a crystalline tantalum component and a crystalline titanium component on the surface of the electrode substrate comprising a valve metal or a valve metal alloy, by the arc ion plating method (hereafter called the AIP method), the heat sintering process by heat sintering of the said electrode substrate to transform only the tantalum component of the AIP undercoating layer, which comprises a valve metal or a valve metal alloy containing a crystalline tantalum component and a crystalline titanium component, into an amorphous substance, and the process to form an electrode catalyst layer on the surface of the AIP undercoating layer comprising a valve metal or a valve metal alloy containing a tantalum component, which is transformed to an amorphous substance, and crystalline titanium component.

The present invention, as the second means for solving the problems, is to provide a manufacturing process of the electrodes for electrolysis, characterized in that in said heat sintering process, the sintering temperature of said heat sintering process is 550 degrees Celsius or more and the sintering duration in said heat sintering is 60 minutes or more; only the tantalum component of said AIP undercoating layer is transformed into an amorphous substance; and at the same time, the valve metal component is partially oxidized.

The present invention, as the third means for solving the problems, is to provide a manufacturing process of the electrodes for electrolysis, characterized in that at the time of forming said electrode catalyst layer, said electrode catalyst layer is formed by the thermal decomposition process.

The present invention, as the forth means for solving the problems, is to provide a manufacturing process of the electrodes for electrolysis, characterized in that the electrode substance comprising said valve metal or valve metal alloy is titanium or a titanium based alloy.

The present invention, as the fifth means for solving the problems, is to provide the manufacturing process of the electrodes for electrolysis, characterized in that the valve metal or the valve metal alloy forming said AIP undercoating layer is composed of at least one kind of metals chosen from niobium, zirconium and hafnium, together with tantalum and titanium.

BRIEF DESCRIPTION OF THE DRAWINGS

FIG. 1 Conceptual Drawing showing one example of the electrode for electrolysis formed by the present invention.

DETAILED DESCRIPTION OF THE INVENTION AND PREFERRED EMBODIMENTS

The following is detailed explanation of the present invention.
FIG. 1 is one example of conceptual diagrams of the electrodes for electrolysis within the present invention. In the present invention, the electrode substrate 1 comprising a valve metal or a valve metal alloy is rinsed to remove contaminants on the surface, such as oil and grease, cutting debris, and salts. Available rinsing methods include water washing, alkaline cleaning, ultrasonic cleaning, vapor washing, and scrub cleaning. By further treatments of surface blasting or etching to roughen and enlarge the surface area, the electrode substrate 1 can enhance its bonding strength and reduce electrolytic current density substantially. An etching treatment can enhance a surface cleaning effect more than simple surface cleaning. Etching is performed using non-oxidizing acids, such as hydrochloric acid, sulfuric acid, and oxalic acid or mixed acids thereof at or near boiling temperatures, or using nitric hydrofluoric acid near the room temperature. Thereafter, as finishing, rinsing with purified water followed by sufficient drying is performed. Prior to the rinsing with purified water, rinsing the etched surface with a large volume of tap water is desirable.

In the present specification, the valve metal refers to titanium, tantalum, niobium, zirconium, hafnium, vanadium, molybdenum, and tungsten. Atypical material for the substrate used for the electrodes comprising a valve metal or a valve metal alloy under the present invention is titanium or a titanium base alloy. Advantages of applying titanium or the titanium base alloy includes, in addition to its high corrosion resistance and economy, a large specific strength (strength/specific gravity) and comparatively easy processing operations, such as rolling and cutting, thanks to the recent development of processing technology. Electrodes under the present invention can be either in a simple rod shape or plate shape or in complicated shape formed by machine processing. The surface can be either smooth or porous. The 'surface of the electrode' herein referred to means any part that can contact electrolyte when immersed.

Following said operations, the AIP undercoating layer 2, comprising a valve metal or a valve metal alloy containing a crystalline substance of tantalum or titanium component, is formed by the AIP method on the surface of the electrode substrate 1 comprising the valve metal or the valve metal alloy.

A desirable combination of metals to be applied to form the AIP undercoating layer, which comprises a valve metal or a valve metal alloy containing a crystalline substance of a tantalum or titanium component, includes tantalum and titanium, or tantalum and titanium plus at least one kind of metals chosen from three elements of niobium, zirconium, and hafnium. When the AIP undercoating layer 2 is formed on the surface of the electrode substrate 1 using these metals selected from the three elements by the AIP method, all of the metals in the AIP undercoating layer 2 will be crystalline substances.

The AIP method is a method to form a strong and dense coating, in which a target metal (evaporation source) is used as a cathode, arc discharge is generated in vacuum; the generated electric energy instantaneously evaporates and discharges the target metal into the vacuum; whereas, the bias voltage (negative pressure) is loaded on the coating object to accelerate metal ions, which tightly adhere, together with reaction gas particles, to the surface of the coating object. When the AIP method is applied, ultra hard coating can be prepared using tremendously strong energy of arc discharge. Moreover, the property of vacuum arc discharge yields to a high ionization rate of the target material, and with the vacuum arc discharge, a dense and highly coherent coating can be produced at a high speed. Dry coating technologies include PVD (Physical Vapor Deposition) and CVD (Chemical Vapor Deposition). The AIP method, being a type of ion plating method as a representative of PVD, is the special ion plating process utilizing vacuum arc discharge. Therefore, the AIP method can provide a high evaporation rate easily. Also, the AIP method enables metals with a high fusing point to evaporate or alloy target materials prepared with substances having different vapor pressure to evaporate nearly at the alloy component ratio, which is usually regarded as difficult by other types of ion plating method. The AIP method is the essential method to form the undercoating layer by the present invention.

In the lines, 20-30, right column, p. 2 of said Patent Document 3, it is disclosed, "as a method to form said amorphous layer of such materials on the metallic substrate, the thin coating preparation method by vacuum sputtering is applied. If the vacuum sputtering method is used, the thin coating in an amorphous state without grain boundary is easy to obtain. For vacuum sputtering, various processes can be applied, such as DC sputtering, high-frequency wave sputtering, ion plating, ion beam plating and cluster ion beam, in which parameters such as a degree of vacuum, substrate temperature, a component or purity of a target plate, a deposition rate (input power) can be optionally controlled to obtain a thin coating with desired properties." And in Examples 1 and 2, the right column and thereafter, p. 3 of Patent Document 3, the high-frequency wave sputtering is employed. This high-frequency wave sputtering method, however, has the following weak points, unlike the AIP method; the evaporation rate of target metal is low and when alloy target materials are prepared by combining substances having different fusing point or a vapor pressure, such as tantalum and titanium, a formed alloy ratio is not constant. In Examples 1 and 2, the right column and thereafter, p. 3 of Patent Document 3, the high-frequency wave sputtering is employed. When tantalum and titanium are applied as the target metal for this high-frequency wave sputtering method, however, both metals produced an amorphous thin coating. Whereas, all of the target_metals became a crystalline thin coating by the AIP method in the present invention. Whereas, by the vacuum sputtering such as DC sputtering, high-frequency wave sputtering, ion plating, ion beam plating, and cluster ion beam, as disclosed in Patent Document 3, the results were same as those by high-frequency wave sputtering, being unable to produce a dense and strong coating layer by the AIP method.

The allowable thickness of the AIP undercoating layer 2 comprising a valve metal or a valve metal alloy containing crystalline tantalum and titanium component usually is 0.1-10 µm, and the thickness is optionally chosen from the practical standpoints such as corrosion resistance and productivity.

Then, only a tantalum component of the AIP undercoating layer 2, which comprises a valve metal or a valve metal alloy containing a crystalline tantalum component and a crystalline titanium component, is transformed into an amorphous substance by heat sintering the electrode substrate 1. As the heat sintering condition at this point, when the sintering temperature is 550 degrees Celsius or more and the sintering duration in said heat sintering is 60 minutes or more, the tantalum component of said AIP undercoating layer 2 is transformed into an amorphous substance and at the same time, a part of the valve metal or valve metal alloy of the AIP undercoating layer 2 containing a tantalum component and a titanium component is oxidized and the AIP undercoating layer 2 becomes an oxide containing layer, and therefore an adhesion capability with an electrode catalyst layer 3 formed on the surface of the AIP undercoating layer 2 by the thermal decomposition process, is improved. Namely, a high-temperature oxidized coating layer, which is formed on the surface of the AIP undercoating layer 2 by 550 degrees Celsius or more in the thermal decomposition process, is bonded with a part of an oxides contained in a condition widely dispersed in the AIP undercoating layer 2 and is strongly bonded with the AIP undercoating layer 2 by the anchor effect. A high temperature oxidation characteristic by a heat sintering process of the AIP undercoating layer 2 is widely different from that of a bulk metal and alloy in a state of a plate or bar generally used. When the titanium substrate having the AIP undercoating layer formed by examples 1-3 of this invention and the titanium substrate without such the AIP undercoating layer are oxidized by a high temperature at the same temperature for the same duration, increased amounts by the weight of the oxidized materials at 525 degrees Celsius and 550 degrees Celsius for 3 hours are respectively 2.09 g/m$^2$ and 2.52 g/m$^2$ in case of the titanium substrate having the AIP undercoating layer and are respectively 0.45 g/m$^2$ and 0.65 g/m$^2$ in case of the titanium substrate without the AIP undercoating layer, and for reference, in case of a pure Ta substrate, the increased amounts by the weight of the oxidized materials at 525 degrees Celsius and 550 degrees Celsius for 3 hours are respectively 14.58 g/m$^2$ and 62.92 g/m$^2$. Namely, the increased amount by weight of oxidized materials of the AIP undercoating layer is widely broader than that of the titanium substrate, but since the AIP undercoating layer of this invention contains a large amount of a tantalum component, the increased amount by weight of oxidized materials of the AIP undercoating layer is widely less than that of the pure tantalum substrate, and therefore it is understood that the AIP undercoating layer of this invention has a high temperature oxidation resistance. Furthermore, when the cross sections of the above are analyzed by a characteristic X ray map of EPMA (a surface analysis of a cross section), in the AIP undercoating layer, a distribution of oxygen accompanied by a high temperature oxidation is observed almost over the whole and a distribution of oxygen by an increase of temperature is still uniform and an oxygen strength is more enlarged, but a distribution of oxygen is not concentrated in an extreme outer surface layer, which corresponds to a high temperature oxidized coating layer. A lot of a distribution of valve metal oxides detected by X ray diffraction analysis, when the AIP undercoating layer is sintered at 550 degrees Celsius or more, is considered to overlap the oxygen distribution. On the contrary, a distribution of oxygen is not found inside of the metal titanium in the titanium substrate without such AIP undercoating layer, and in an extreme outer surface layer, which corresponds to a high temperature oxidized coating layer, an oxygen is strongly concentrated in a thickness of 0.1 µm, when heat sintered at 525 degrees Celsius for 3 hours, and the oxygen is strongly concentrated in a thickness of 0.2 µm when heat sintered at 600 degrees Celsius for 3 hours. Namely, the high temperature oxidized coating layer formed by the heat sintering process of the AIP undercoating layer is extremely thin and almost all oxygen is considered to be invaded into the AIP undercoating layer. At this point, the tantalum component of the AIP undercoating layer is transformed into amorphous substance. On the other hand, even if a heat history of the same degree as this is applied to the AIP undercoating layer, a crystalline state is not always transformed into amorphous substance. As shown in comparative example 1, when a heat sintering process is not applied to the AIP undercoating layer, even if a heat sintering treatment at 535 degrees Celsius for 15 minutes (a thermal decomposition coating) is repeated by 12 times and an electrode catalyst comprising iridium oxide and tantalum oxide is provided, which however corresponds to a treatment at net 535 degrees Celsius for 3 hours, the tantalum component as an amorphous substance is not confirmed by X ray diffraction analysis, but crystalline metal tantalum of the same is detected. Furthermore, when this cross section is analyzed by a characteristic X ray map of EPMA, an invasion in extent of oxygen is shallower than that of the AIP undercoating layer to which a high temperature oxidation by a heat sintering treatment is applied, and oxygen strength thereof is also smaller. Namely, when the same degree of a heat history and a heat load are given in a heat sintering process to the AIP undercoating layer and in a process forming an electrode catalyst layer on a surface of the AIP undercoating layer without receiving a heat sintering process, a crystalline substance of the tantalum component is transformed into amorphous substance in the former, but the crystalline substance of tantalum is maintained in the latter. This fact is considered that a diffusion of oxygen is more controlled by the electrode catalyst layer, which has a thickness from several times to several tens times of that of the high temperature oxidation layer. Furthermore, since the electrode catalyst layer is layered repeatedly by many times, whenever a coating time of the electrode catalyst layer is increased, the diffusion speed of oxygen is decreased. Although amorphous metals or alloys are usually crystallized at a temperature higher than a specific crystallization temperature, the crystalline tantalum component of the AIP undercoating layer used in this invention shows a behavior, which is reverse transformed into amorphous by a high temperature according to a heat sintering treatment. Although a mechanism of transformation into an amorphous substance is not always clear, it is considered that an extremely thin high temperature oxidized coating layer is formed, and lots of oxygen other than that is diffused into the AIP undercoating layer rapidly and is doped into a crystalline lattice of metals or alloys in the AIP undercoating layer. The anti-heat deformation effect against thermal oxidation, the densification effect, and the anchor effect, which are provided by the AIP undercoating layer, which has the amorphous phase prepared by said heat sintering process and an oxide containing layer having, at the top, a dense, extremely thin, high-temperature oxidized coating, not only alleviate a thermal effect during the coating process of an electrode activation substance as described below, but also alleviate electrochemical oxidation and corrosion of the electrodes while used for electrolysis, and are considered to greatly contribute to durability of electrodes.

Next, the electrode catalyst layer 3 having precious metal or precious metal oxides as a main catalyst is formed on the AIP undercoating layer 2 in said manner. The applied electrode catalyst is suitably selected from platinum, ruthenium oxide, iridium oxide, rhodium oxide, palladium oxide, etc., to be used alone or as combined, depending on types of electrolysis. For the electrodes for oxygen generation, in which high durability is required against generated oxygen, low pH, and organic impurities, iridium oxide is the most suitable. In order to enhance adhesiveness to the substrate or durability in electrolysis, it is desirable to mix materials, such as titanium oxide, tantalum oxide, niobium oxide, and tin oxide.

Applicable coating methods of this electrode catalyst layer include the thermal decomposition process, the sol-gel process, the paste process, the electrophoresis method, the CVD process, and the PVD process. Above all, the thermal decomposition process as described in detail in JP 48-3954 B and JP 46-21884 B, in which chemical compound solution containing elements, which constitute a main substance of the coating layer, is applied onto the substrate, followed by drying and heat sintering processing to form target oxides through thermal decomposition and thermal synthesis reaction, is very suitable. As the metal compounds for electrode catalyst layer elements, substances such as metal alkoxide dissolved in an organic solution, metal chlorides or nitrate salts dissolved in generally strong acid aqueous solution and resinate dissolved in grease can be used. To said substances, optionally, hydrochloric acid, nitric acid, and oxalic acid are added as stabilizing agent, and as a complexing agent, salicylic acid, 2-ethylhexanoate, acetyl acetone, EDTA, ethanolamine, citric acid, ethylene glycol are added, and a coating solution is prepared, which is applied onto the surface of said oxide interlayer using known coating tools and methods including brush, roller, spray, spin coat, printing and electrostatic coating. After drying the coating, heat sintering processing is provided in the furnace having oxidizing atmosphere like air.

The following are embodiment examples and comparative examples regarding to the electrodes for electrolysis and their manufacturing under the present invention, which, however, are not necessarily limited to the present invention.

Example 1

The surface of a JIS 1st class titanium plate is processed with dry blasting by a cast iron grid (G120 size), followed by acid washing for 10 minutes in aqueous solution of boil-concentrated hydrochloric acid as the cleansing process of electrode substrate. The washed electrode substrate was installed in the arc ion plating unit with a Ti—Ta alloy target as evaporation source, and applied with the Ti—Ta alloy coating onto the surface as an undercoating layer. Coating conditions are shown in Table 1.

TABLE 1

| | |
|---|---|
| Target (evaporation source): | Alloy disk comprising Ta:Ti = 60 wt %:40 wt % (back-surface water-cooled) |
| Time to reach vacuum: | $1.5 \times 10^{-2}$ Pa or less |
| Substrate Temp.: | 500 degrees Celsius or below |
| Coating press.: | $3.0 \times 10^{-1} \sim 4.0 \times 10^{-1}$ Pa |
| Evaporation source Input power: | 20~30 V, 140~160 A |
| Coating time: | 15~20 min. |
| Coating thickness: | 2 micron (Weight equivalent) |

The composition of said alloy layer was same as that of the target, from the fluorescent X-ray analysis of the stainless plate installed for inspection in parallel with the electrode substrate. However, the X-ray diffraction carried out after coating the AIP undercoating layer revealed that clear crystalline peaks were observed in the substrate bulk itself and belonging to the AIP undercoating layer, demonstrating that said undercoating layer comprises crystalline substance of titanium in hexagonal close packing (hcp) and tantalum in body-centered cubic (bcc) with a small quantity of monoclinic system. Then, the said substrate applied the AIP undercoating layer was followed by heat sintering for 180 minutes at 530 degrees Celsius in an electric furnace of air circulation type. The X-ray diffraction analysis illustrated broad patterns of tantalum phase belonging to the AIP undercoating layer, evidencing that the tantalum phase of said undercoating layer was transformed from crystalline substance into amorphous one by the heat sintering. In addition, clear peaks of titanium phase belonging to the titanium substrate and the AIP undercoating layer were observed. Next, coating solution prepared by tetrachloride iridium and tantalum pentachloride dissolved in concentrated hydrochloric acid was applied on the surface of said AIP undercoating layer, followed by drying and thermal decomposition for 15 minutes at 535 degrees Celsius in an electric furnace of air circulation type, to form electrode catalyst layer comprising mixed oxides of iridium oxide and tantalum oxide. The applied amount of said coating solution was determined so that the coating thickness per treatment becomes approximately 1.0 g/m$^2$ as iridium metal equivalent. The procedure of coating and sintering was repeated twelve times to obtain 12 g/m$^2$ of electrode catalyst layer as iridium metal equivalent. The X-ray diffraction analysis on this sample illustrated clear peaks of iridium oxide belonging to the electrode catalyst layer and clear peaks of the titanium phase belonging to the titanium substrate and the AIP undercoating layer. Moreover, broad patterns of tantalum phase belonging to the AIP undercoating layer was observed, proving that the tantalum phase of the AIP undercoating layer keeps amorphous state even after the heat sintering process performed to obtain electrode catalyst layer.

The following evaluation of the electrolysis life was carried out for the electrodes for electrolysis prepared in said manner.
Current density: 500 Å/dm$^2$,
Electrolysis temperature: 60 degrees Celsius,
Electrolyte: 150 g/l Sulfuric acid aqueous solution, and
Counter electrode: Zr plate. The point at which the cell voltage increased by 1.0 V from the initial cell voltage is regarded as the end of electrolysis life. Table 2 shows the thermal treatment conditions of Ti—Ta alloy AIP undercoating layer by the heat sintering, X-ray diffraction analysis results of phase conversion of the component of the AIP undercoating layer obtained and the electrolysis life of this electrode. It is cleared that the durability of this electrode is remarkably improved by an effect of phase conversion by the heat sintering from crystalline substance into amorphous one of the component of the AIP undercoating layer by the heat sintering, compared with Comparative Examples shown thereafter.

Example 2

The electrode for electrolysis was prepared in the same manner as with Example 1, except the heat sintering in air was made for 120 minutes at 560 degrees Celsius and evaluation of the electrolysis life was performed in the same procedures. After the heat sintering, the X-ray diffraction analysis was conducted, from which it was revealed that broad patters of tantalum phase and peaks of tantalum oxides belonging to the AIP undercoating layer were present on all electrodes and that tantalum phase of said undercoating layer had been transformed from crystalline substance into amorphous one by the heat sintering process and a part of tantalum is converted to an oxide. As known from the results in Table 2, tantalum phase was transformed from crystalline substance into amorphous one by a thermal decomposition of the alloy undercoating layer as well as tantalum oxide was formed, by which it was confirmed that the electrode life was prolonged furthermore.

Example 3

The electrode for electrolysis is prepared in the same manner as with Example 1, except the heat sintering in air was made for 80 minutes at 575 degrees Celsius and evaluation of the electrolysis life was performed in the same procedures. After the heat sintering, the X-ray diffraction analysis was conducted, from which it was revealed that broad patters of tantalum phase and peaks of tantalum oxides and titanium oxides belonging to the AIP undercoating layer were present on all electrodes and that tantalum phase of said undercoating layer had been transformed from crystalline substance into amorphous one by the heat sintering process and a part of tantalum is converted to an oxide. As known from the results in Table 2, tantalum phase was transformed from crystalline substance into amorphous one by the heat sintering of the AIP undercoating layer as well as two oxide phases of tantalum oxide and titanium oxides were formed, by which it was confirmed that the electrode life was prolonged furthermore.

Comparative Example 1

The electrode for electrolysis is prepared in the same manner as with Example 1, except the heat sintering of the AIP undercoating layer was not made, and evaluation of the electrolysis life was performed in the same procedures. The electrode life of this comparative example 1 was only 985 hours. From this result, it was cleared that the durability of the electrode was remarkably improved only by the heat sintering of the AIP undercoating layer of the substrate according to this invention. The X-ray diffraction analysis on this sample illustrated clear peaks of iridium oxide belonging to the electrode catalyst layer and clear peaks of the titanium phase belonging to the titanium substrate and the AIP undercoating layer. Moreover, clear peaks of tantalum phase belonging to the AIP undercoating layer was observed, proving that the tantalum phase of the AIP undercoating layer was not transformed into amorphous state and kept crystalline state even after the thermal decomposition performed to obtain electrode catalyst layer.

Comparative Example 2

The electrode substrate is treated in the same manner as with Example 1, except the heat sintering process of the AIP undercoating layer in air was made for 180 minutes at 470 degrees Celsius. The X-ray diffraction analysis after the heat sintering process of the AIP undercoating layer revealed that a sharp crystalline peaks belonging to the substrate bulk and the AIP undercoating layer were present and that the AIP undercoating layer had not been transformed from crystalline substance to amorphous one by the heat sintering process.

Then, the electrode catalyst layer was prepared in the same manner as with Example 1 and evaluation of the electrolysis life was performed in the same procedures. The electrode life by this comparative example 2 was the almost same life as the comparative example 1. From this result, it was cleared that the durability of the electrode is remarkably influenced by an effect of phase conversion by the heat treatment from crystalline substance into amorphous one of the component of the AIP undercoating layer and the formation of the oxides by the heat sintering process.

TABLE 2

| | Heat sintering of the AIP undercoating layer | Phase conversion of components of the AIP undercoating layer | Electrode life |
|---|---|---|---|
| Example 1 | 530 Degrees Celsius, 180 minutes | Ta phase: crystalline→amorphous<br>Ti phase: crystalline substance preserved | 1260 hours |
| Example 2 | 560 Degrees Celsius, 120 minutes | Ta phase: crystalline→amorphous, $Ta_2O_5$<br>Ti phase: crystalline substance preserved, TiO | 1380 hours |
| Example 3 | 575 Degrees Celsius, 80 minutes | Ta phase: crystalline→amorphous, $Ta_2O_5$<br>Ti phase: crystalline substance preserved, TiO | 1590 hours |
| Comparative Example 1 | | Ta phase: crystalline<br>Ti phase: crystalline | 985 hours |
| Comparative Example 2 | 470 Degrees Celsius, 180 minutes | Ta phase: crystalline<br>Ti phase: crystalline | 1020 hours |

As mentioned above, according to the present invention, the AIP undercoating layer comprising valve metal or valve metal alloy containing crystalline tantalum component and crystalline titanium component is formed on the surface of the electrode substrate comprising valve metal or valve metal alloy by the AIP method, and then, the heat sintering process to transform tantalum component of the AIP undercoating layer into amorphous state and then the thermal decomposition is made in order to form the electrode catalyst on the surface of the AIP undercoating layer. Namely, crystalline planes do not essentially exist in amorphous phase of tantalum component of the AIP undercoating layer and movement and proliferation of dislocation do not occur, and therefore, neither grow of crystalline grain by the heat sintering process to form the electrode catalyst layer nor thermal deformation by movement of dislocation occurs. Thermal deformation will occur only to titanium component in crystalline phase, being alleviated to the AIP undercoating layer on the whole. Thermal deformation of the AIP undercoating layer appears in the form of changes in surface shape or structure, leaving potential risk of gap formation between the AIP undercoating layer and the electrode catalyst layer laminated by the heat sintering process. Transformation of the AIP undercoating layer into amorphous will reduce said potential risk. Also, regarding titanium component of crystalline phase in the AIP undercoating layer, the heat sintering process of the AIP undercoating layer results in lessening internal stress, a cause of deformation in the future, working as annealing, and therefore, thermal deformation by the heat sintering process to form electrode catalyst layer is lessened by that much, since in the AIP undercoating layer right after the AIP treatment of electrode substrate, a large internal stress remains just like other physical or chemical vapor deposition and plating. Furthermore, when the electrode is heated and cooled as the whole in the thermal decomposition process to form the electrode catalyst, a sharing stress occurred in the boundary from the difference of a coefficient of thermal expansion between the AIP undercoating layer and the electrode catalyst layer is remained behind and it results in one reason of a cause of an exfoliation of the electrode catalyst layer in the future. However, as described in detail in the Patent Document 6 by inventors of this invention, the high temperature oxidation coating layer formed on the surface of valve metals or valve metal alloys in a state in which noble metals or noble metal oxides of the electrode catalyst components do not exist, is minute and firm. On the other hand, the high temperature oxidation coating layer formed on the surface of valve metals or valve metal alloys in a state in which noble metals or noble metal oxides of the electrode catalyst components exist, is thick and fragile. Accordingly, the high temperature oxidation coating layer formed on the surface of the AIP undercoating layer by the heat sintering process prior to the thermal decomposition of the electrode catalyst, is minute and firm, and a resistance against a sharing stress occurred in the boundary between the AIP undercoating layer and the electrode catalyst layer is strengthened. Therefore, corrosion development on the substrate during electrolysis which may be caused by electrolyte having reached the boundary between the substrate and the AIP undercoating layer can be suppressed, since the boundary of the AIP undercoating layer and the electrode catalyst layer is strongly bonded. Accordingly, the AIP undercoating layer and the electrode catalyst layer have longer life than the prior simple high temperature oxidation coating layer and the electrode catalyst layer. On the other hand, when the AIP undercoating layer is formed without the heat sintering process and the electrode catalyst layer is formed on the surface of the AIP undercoating layer by the thermal decomposition, the crystalline state of tantalum component of the AIP undercoating layer is not transformed into amorphous state.

Furthermore, according to the present invention, in the heat sintering process, if the sintering temperature is set at 550 degrees Celsius or more and the sintering time for 60 minutes or more; tantalum component of the AIP undercoating layer is transformed into amorphous; and the valve metal components are partially oxidized, the AIP undercoating layer becomes oxides-contained layer and the high temperature oxide coating produced on the surface of the AIP undercoating layer bonds with part of oxides contained as widely dispersed in the AIP undercoating layer, achieving stronger bonding with the AIP undercoating layer by the "anchor effect" and the bonding between the AIP undercoating layer and the electrode catalyst layer is strengthened furthermore.

The invention claimed is:

1. A manufacturing process of the electrodes for electrolysis, characterized by;
    the process to form an arc ion plating undercoating layer (hereafter called the AIP undercoating layer) comprising valve metal or valve metal alloy containing crystalline tantalum component and crystalline titanium component on the surface of the electrode substrate comprising valve metal or valve metal alloy by the arc ion plating method (hereafter called the AIP method),
    the heat sintering process by heat sintering the said electrode substrate to transform tantalum component only of the AIP undercoating layer comprising valve metal or valve metal alloy containing crystalline tantalum component and crystalline titanium component into amorphous substance, and
    the process to form electrode catalyst layer on the surface of said the AIP undercoating layer comprising valve metal or valve metal alloy containing tantalum component transformed to amorphous substance and crystalline titanium component.

2. A manufacturing process of the electrodes for electrolysis according to claim 1 further characterized by said heat sintering process wherein the sintering temperature of said heat sintering process is 550 degrees Celsius or more and the sintering duration in said heat sintering is 60 minutes or more; only tantalum component of said AIP undercoating layer is transformed into amorphous substance; and at the same time valve metal component is partially oxidized.

3. A manufacturing process of the electrodes for electrolysis according to claim 1 further characterized by said heat sintering process wherein at the time of forming said electrode catalyst layer, said electrode catalyst layer is formed by the thermal decomposition process.

4. A manufacturing process of the electrodes for electrolysis according to claim 1 further characterized wherein said electrode substance comprising said valve metal or valve metal alloy is titanium or titanium base alloy.

5. A manufacturing process of the electrodes for electrolysis according to claim 1 further characterized by the process wherein said valve metal or valve metal alloy forming said AIP undercoating layer is composed of at least one kind of metals chosen from among niobium, zirconium and hafnium, together with tantalum and titanium.

* * * * *